US012709567B2

(12) United States Patent
Lim et al.

(10) Patent No.: US 12,709,567 B2
(45) Date of Patent: Aug. 18, 2026

(54) GLASS-CERAMICS WITH PLASMA RESISTANCE AND PARTS FOR DRY ETCHING COMPRISING THE SAME

(71) Applicant: HASS CO., LTD., Gangwon-do (KR)

(72) Inventors: Hyung Bong Lim, Gyeonggi-do (KR); Yong Su Kim, Gangwon-do (KR); Kyung Sik Oh, Incheon (KR); Young Pyo Hong, Gangwon-do (KR); Sung Min Kim, Gyeonggi-do (KR); Joon Hyung Kim, Gyeonggi-do (KR); Si Won Son, Seoul (KR); Yena Kim, Seoul (KR)

(73) Assignee: HASS CO., LTD., Gangneung-si (KR)

( * ) Notice: Subject to any disclaimer, the term of this patent is extended or adjusted under 35 U.S.C. 154(b) by 1060 days.

(21) Appl. No.: 17/656,308

(22) Filed: Mar. 24, 2022

(65) Prior Publication Data

US 2022/0220023 A1 Jul. 14, 2022

Related U.S. Application Data

(63) Continuation of application No. PCT/KR2019/012530, filed on Sep. 26, 2019.

(30) Foreign Application Priority Data

Sep. 25, 2019 (KR) ........................ 10-2019-0118217

(51) Int. Cl.
*C03C 10/00* (2006.01)
*C03B 32/02* (2006.01)
(Continued)

(52) U.S. Cl.
CPC .............. *C03C 10/00* (2013.01); *C03B 32/02* (2013.01); *C03C 4/20* (2013.01); *C03C 19/00* (2013.01);
(Continued)

(58) Field of Classification Search
CPC ............................ C03C 10/00; C03C 10/0009
See application file for complete search history.

(56) References Cited

U.S. PATENT DOCUMENTS 5,804,520 A 9/1998 Morinaga et al.
2007/0082294 A1 4/2007 Goto et al.
(Continued)

FOREIGN PATENT DOCUMENTS

CN 104736126 A 6/2015
JP 08-111024 A 4/1996
(Continued)

OTHER PUBLICATIONS

JPH11199274A machine translation (Year: 1999).*
(Continued)

*Primary Examiner* — Cameron K Miller
(74) *Attorney, Agent, or Firm* — NKL LAW; Jae Youn Kim

(57) ABSTRACT

A crystallized glass includes crystalline and vitreous structures, in which the crystalline structure includes lithium disilicate as a main crystalline phase and at least one crystalline phase among lithium phosphonate ($Li_3PO_4$), lithium metasilicate ($Li_2SiO_3$), silica ($SiO_2$), and zirconia ($ZrO_2$) as a sub-crystalline phase, has an excellent processability and an excellent plasma corrosion resistance, thereby being useful as a material for production of parts for various dry etching apparatuses.

1 Claim, 4 Drawing Sheets

(51) Int. Cl.

| | |
|---|---|
| ***C03C 4/20*** | (2006.01) |
| ***C03C 19/00*** | (2006.01) |
| ***H01J 37/32*** | (2006.01) |
| *H10P 50/24* | (2026.01) |

(52) U.S. Cl.
CPC .... *H01J 37/32642* (2013.01); *C03C 2204/00* (2013.01); *H01J 2237/334* (2013.01); *H10P 50/242* (2026.01)

(56) References Cited

U.S. PATENT DOCUMENTS

| | | | | |
|---|---|---|---|---|
| 2014/0338834 | A1 | 11/2014 | Tanaka | |
| 2015/0374589 | A1 | 12/2015 | Rampf et al. | |
| 2016/0236971 | A1 | 8/2016 | Rampf et al. | |
| 2022/0096212 | A1* | 3/2022 | Lim | A61C 13/083 |
| 2022/0096213 | A1* | 3/2022 | Lim | A61C 13/0022 |
| 2024/0090986 | A1* | 3/2024 | Lim | C03C 4/02 |
| 2024/0108444 | A1* | 4/2024 | Lim | C03C 10/0027 |
| 2024/0374361 | A1* | 11/2024 | Lim | C03C 10/0027 |

FOREIGN PATENT DOCUMENTS

| | | | |
|---|---|---|---|
| JP | 1997-235137 | A | 9/1997 |
| JP | 10-158034 | A | 6/1998 |
| JP | 1999-199274 | A | 7/1999 |
| JP | 11-228172 | A | 8/1999 |
| JP | 2003-292337 | A | 10/2003 |
| JP | 2007-223884 | A | 9/2007 |
| JP | 2017-501098 | A | 1/2017 |
| KR | 10-0972567 | B1 | 7/2010 |
| KR | 10-2011-0086851 | A | 8/2011 |
| KR | 10-2012-0057272 | A | 6/2012 |
| KR | 10-2014-0075669 | A | 6/2014 |
| KR | 10-1491568 | B1 | 2/2015 |
| KR | 10-1514197 | B1 | 4/2015 |
| KR | 10-2018-0055516 | A | 5/2018 |
| KR | 10-1988221 | B1 | 6/2019 |
| WO | 2010/011113 | A2 | 1/2010 |

OTHER PUBLICATIONS

International Search Report for corresponding International Application No. PCT/KR2019/012530 mailed Jun. 23, 2020.

Written Opinion for corresponding International Application No. PCT/KR2019/012530 dated Jun. 23, 2020.

Chinese Office Action dated Aug. 5, 2023 for corresponding Chinese Application No. 201980100246.7 and English translation.

Notice of Reasons for Refusal dated May 2, 2023 for corresponding Japanese Application No. 2022-518856 and English translation.

* cited by examiner

GLASS-CERAMICS WITH PLASMA RESISTANCE AND PARTS FOR DRY ETCHING COMPRISING THE SAME

CROSS REFERENCE TO RELATED APPLICATIONS

This is a continuation of International Application No. PCT/KR2019/012530 filed on Sep. 26, 2019 which claims priority from Korean Patent Application No. 10-2019-0118217 filed on Sep. 25, 2019. The contents of these applications are incorporated herein by reference in their entireties.

TECHNICAL FIELD

The present disclosure relates to crystallized glass having plasma corrosion resistance and dry etching process parts including the same. More particularly, the present disclosure relates to crystallized glasses containing lithium disilicate as a main crystalline phase having plasma corrosion resistance and to various useful dry etching process parts including the same.

BACKGROUND

Recently, in the global semiconductor market, a fierce competition is in progress to secure market share amid a decline in the price of semiconductor devices. Accordingly, in order to secure price competitiveness in the global semiconductor market, research and development are actively being conducted on technology for increasing the integration of semiconductor devices and the diameter technology Si-wafer. In addition, the development of parts and materials for the high-yield production of semiconductor devices in large-diameter wafers is also actively being carried out.

Among many semiconductor/display manufacturing processes, deposition and etching are mostly performed at high temperatures and high pressures. Therefore, the parts inside the deposition and etching equipment must be resistant to heat and plasma and have excellent chemical properties. Among them, a dry etching process is one of the most important processes and is used to form micropatterns by partially removing lower layers under a mask pattern layer so that the same pattern can be formed on the wafer. Among semiconductor process equipment, dry etching equipment uses expensive expendable parts compared to other equipment. In the dry etching process, while Si-wafer is etched by plasma activation of gas such as $CF_4$, $NF_3$, $BCl_3$, $CCl_4$, ceramic parts in the equipment are also worn by etching. In the process in which plasma etching is repeatedly performed for a long time, ceramic members may suffer surface damage, resulting in problems that the use cycle of the expendable parts is shortened, and particles generated due to the corrosion of the ceramic members land on the Si-Wafer, causing defects.

On the other hand, among the parts used in dry etching equipment, a focus ring which is one of essential expendable parts protects an electrostatic chuck in the etching process and enables plasma to be evenly distributed to help the dry etching proceed uniformly. The electrostatic chuck serves to make the Si-wafer entering the chamber fixed horizontally, and the edge ring prevents electric current from being concentrated at the end of the Si-wafer. The mentioned three parts are mainly made of alumina ($Al_2O_3$), quartz (Quartz) having similar physical properties to wafers, or zirconia ($ZrO_2$).

Alumina ($Al_2O_3$) exhibits excellent characteristics at high temperatures such as 1600° C. to 1700° C. and has high density and high hardness (for example, 15 to 20 times those of general metals). Therefore, alumina has high wear resistance to fluorinated gas and has excellent corrosion resistance to chemicals because it is inert. For those reasons, alumina is the most used material for semiconductor etching equipment. However, due to the low thermal shock resistance and the generation of particles etched from the alumina itself during the etching process, the alumina has a problem of lowering the yield of the Si-wafers. In addition, the yield of powder production from alumina is low, and the cost for production of parts from alumina is high because molding and processing of alumina into large objects is very difficult.

In the case of quartz, the price is lower than that of other materials. In addition, since the siloxane (silicon-oxygen) chain, which is the bonding structure of the quartz, has the advantage of being much higher than the carbon-oxygen bonding energy, the quartz exhibits little change in physical and mechanical properties with temperature change. However, due to the poor chemical resistance of $SiO_2$, the quartz is very limitedly used for etching equipment in which fluorinated gas is used. Moreover, the low high-temperature strength of the quartz is also pointed out as a disadvantage.

Zirconia ($ZrO_2$) usually uses 3Y-TZP, has excellent durability, and has excellent abrasion resistance and corrosion resistance. Therefore, zirconia generates less particles than alumina. However, high processing cost and low thermal shock resistance are pointed out as disadvantages of zirconia.

These parts are consumables with a fast replacement cycle, for example, a replacement cycle of about 10 days in the dry etching process. In order to replace these consumables, the operation of the equipment needs to be stopped. After the replacement of the parts, it takes a lot of time to set up the required process conditions. This causes increases in cost due to time loss and material consumption.

Due to this high material cost, dry etching process parts are actually sometimes reused through acid- or alkali-based cleaning instead of being replaced according to the replacement cycle. In this case, there is a problem in that it takes a lot of time to control the atmosphere in the chamber because the surface of the parts is roughened due to the surface damage and pores are generated during the etching process, resulting in moisture adsorption.

Recently, since high-power plasma has been used due to the high integration of semiconductor elements, the related parts are required to have plasma resistance. In addition, due to the enlargement of parts, materials that satisfy ease of processing, precision of processing dimensions, material durability, and competitive material cost are required.

Therefore, there is a case that the surface of alumina is coated with $Y_2O_3$ having excellent plasma resistance through thermal spray coating. However, in this case, since there is a difference in the coefficient of thermal expansion between the material surface and $Y_2O_3$, peeling or breakage of the coating film occurs, and the service life is short, so re-coating is required.

Silicon carbide (SiC) material has excellent high-temperature characteristics, abrasion resistance, and corrosion resistance, and has the advantage of higher thermal shock properties and less particle generation than conventional alumina, zirconia, orgh quartz. However, the manufacturing process thereof is difficult to the extent that the physical properties vary from product to product even during the sintering process in the same furnace, and it is difficult to cut the material due to excessively high hardness.

As an example of a conventional technique for improving plasma corrosion resistance as described above, Korean Patent No. 10-1491568 discloses a sintered solid solution-containing ceramic coating for use on surfaces of semiconductor processing apparatuses exposed to halogen plasma. The sintered solid solution-containing ceramic coating provides advantageous mechanical coating properties, in which the coating is formed from zirconium oxide in a molar concentration range of 96% to 94% by mole and yttrium oxide in a molar concentration range of 4% to % by mole, and the sintered solid solution-containing ceramic coating has an average grain size of 0.5 μm to 8.0 μm.

In addition, Korean Patent Application Publication No. 10-2011-0086851 discloses: glazes comprising metal oxyfluorides, which can be used as plasma corrosion resistant protective coatings or substrates, for example, solid substrates such as aluminum oxide, aluminum nitride, quartz, silicon carbide, silicon nitride; glass ceramics; compositions including the same; and a component for a semiconductor processing apparatus, the component including the composition. Specifically, as the part for a semiconductor processing apparatus, the surface of the part is exposed to halogen-containing reactive plasma during semiconductor processing. The part includes a ceramic or glass substrate having a melting point higher than about 1600° C. and a protective coating applied over at least one surface of the substrate. The coating comprises at least one yttrium-based fluoride crystalline phase, or at least one yttrium-based oxyfluoride crystalline phase, or at least one amorphous phase containing yttrium and fluorine, or a combination thereof.

In addition, Korean Patent No. 10-1514197 relates to a component useful as a device in a plasma processing chamber and discloses a bonded ceramic component resistant to reactive plasma. The bonded component includes a glass-ceramic bonding layer. The glass-ceramic bonding layer includes 0.1% to 50% by volume of an amorphous phase with respect to the total volume thereto.

In addition, International Patent Publication No. WO2010/011113 A2 discloses a ceramic coating having plasma resistance. Specifically, a to-be-coated body used in a plasma processing apparatus and a plasma-resistive ceramic coating including a ceramic coating film formed on the surface of the to-be-coated body, exhibiting a corrosion rate of 13 to 25 nm/min to plasma generated at 800 W, and having a pore content of 0.1 to 1%. The to-be-coated body includes aluminum, stainless steel, quartz, or a ceramic material, and is at least one selected from the group consisting of a gas distribution plate, an electrostatic chuck, a showerhead, an inner wall of a chamber, a cylinder, and a focus ring.

In addition, Korea Patent No. 10-0972567 discloses a plasma-resistant member and a manufacturing method thereof. In a Y—Si—Al—O—N glass composition, the glass composition includes 5% to 30% by mole of $Y_2O_3$, 15% to 40% by mole of $Al_2O_3$, 10% to 80% by mole of $SiO_2$, 0% to 20% by mole of $Si_3N_4$. This substantial plasma-resistant member is manufactured by forming a coating layer using the glass composition on a substrate made of any one material selected from alumina, quartz, and metal. Here, it is described that any one of thermal spraying, aerosol deposition, sputtering, electron beam deposition, thermal deposition, and laser deposition can be used for the coating.

According to the above-described related arts, parts are generally manufactured from materials such as aluminum oxide, aluminum nitride, quartz, silicon carbide, silicon nitride, etc., and a protective coating is formed on the parts to impart plasma resistance to the parts. As the protective coating compositions, yttrium-based glass compositions, glass ceramics containing a fluorinated group, and ceramic coating compositions such as zirconia-based ceramics are disclosed.

SUMMARY

The present disclosure is to provide a novel use of crystallized glass. In particular, the present disclosure is to provide crystallized glass including lithium disilicate as a main crystalline phase and having excellent processability. Thus, the crystallized glass is effective in reducing product processing costs and time due to easy processability and has plasma corrosion resistance represented by a low etch rate and a low weight reduction after etching.

The present disclosure is to provide parts for dry etching equipment, the parts being made of crystallized glass including lithium disilicate as a main crystalline phase and having excellent processability, thereby addressing the difficulty in processing and improving thermal shock stability during large-area fabrication of conventional semiconductor and electronic material ceramics. In addition, the parts have improved durability with respect to semiconductor plasma etching, thereby being extended in a replacement cycle.

The present disclosure provides crystallized glass having plasma corrosion resistance, the glass including crystalline and vitreous structures, in which the crystalline structure includes lithium disilicate as a main crystalline phase and at least one crystalline phase among lithium phosphonate ($Li_3PO_4$), lithium metasilicate ($Li_2SiO_3$), silica ($SiO_2$), and zirconia ($ZrO_2$) as a sub-crystalline phase.

In the plasma corrosion-resistive crystallized glass of the present disclosure, the silica crystalline phase may be at least one selected from the group consisting of cristobalite, low-temperature quartz (α-quartz) and tridymite.

In the plasma corrosion-resistive crystallized glass of the present disclosure, the crystalline phase may have an average grain size of 0.05 μm to 5 μm.

In the plasma corrosion-resistive crystallized glass according to one embodiment of the present disclosure, the crystalline phase may have an average grain size of 0.05 μm to 0.5 μm.

In the plasma corrosion-resistive crystallized glass according to one embodiment of the present disclosure, the crystalline phase may have an average particle size of 0.5 μm to 5 μm.

The plasma corrosion-resistive crystallized glass according to one embodiment of the present disclosure may have a surface roughness Ra of 0.1 μm at a maximum.

Another embodiment of the present disclosure provides a method of preparing plasma corrosion-resistive crystallized glass, the method including a process of performing primary crystallization heat treatment at 400° C. to 850° C. on a melt of a glass composition including: 60% to 85% by weight of $SiO_2$; 10% to 15% by weight of $Li_2O$; 1% to 6% by weight of $P_2O_5$; 0.1% to 5% by weight of a divalent element oxide alone represented by $Me^{II}O$ (where, $Me^{II}$ is Ca, Mg, Zn, Ba, or Be) or a mixture of the divalent element oxides; 0.1% to 5% by weight of a monovalent element oxide alone represented by $Me^{I}_2O$ (where $Me^{I}$ is K, Na, Rb, or Cs) or a mixture of the monovalent element oxides; and 1% to 10% by weight of a trivalent element oxide alone represented by $Me^{III}_2O_3$ (where, $Me^{III}$ is Al, B, Y, La, Ga, or In) or a mixture of the trivalent element oxides.

The method of preparing a plasma corrosion-resistive crystallized glass to increase strength, according to a preferred embodiment of the present disclosure, includes a process of performing secondary crystallization heat treatment at 800° C. to 950° C. after the primary crystallization heat treatment.

The method of preparing a plasma corrosion-resistive crystallized glass, according to one embodiment of the present disclosure, includes a grinding process performed after the primary crystallization heat treatment and a polishing process performed after the secondary crystallization heat treatment performed at 800° C. to 950° C.

The method of preparing a plasma corrosion-resistive crystallized glass, according to another embodiment of the present disclosure, includes a grinding and polishing process performed after the secondary crystallization heat treatment.

In the method of preparing a plasma corrosion-resistive crystallized glass, according to one embodiment of the present disclosure, the polishing process is performed such that a surface roughness Ra becomes 0.1 μm at a maximum.

A further embodiment of the present disclosure provides parts for a dry etching process, the parts including the plasma corrosion-resistive crystallized glass according to the former embodiments, and a yet further embodiment of the present disclosure provides parts for a dry etching process, the parts being made of the plasma corrosion-resistive crystallized glass according to the former embodiments.

According to embodiments, the parts for a dry etching process may be at least one selected from a focus ring, an electrostatic chuck, and an edge ring.

The present disclosure provides a plasma corrosion-resistive material having superior strength to general glass material, the corrosion-resistive material being efficient in reducing a product processing cost and time due to easy processability thereof compared to alumina or zirconia which requires a lot of cost and time for product processing due to high hardness thereof. In addition, the present disclosure can provide a plasma corrosion-resistive material exhibiting a low etch rate compared to conventional materials and experiences a small amount of weight loss after etching.

Accordingly, by providing a dry etching process part having excellent processability and excellent plasma corrosion resistance, it is possible to well cope with high integration of semiconductor elements and with an increase in the diameters of Si-wafers.

BRIEF DESCRIPTION OF THE DRAWINGS

FIG. 2A represents a crystallized glass (glass-ceramics) specimen according to one embodiment of the present disclosure; FIG. 2B represents an alumina specimen according to one embodiment of the present disclosure, and FIG. 2C represents a zirconia specimen according to one embodiment of the present disclosure.

DETAILED DESCRIPTION

Figure 1:
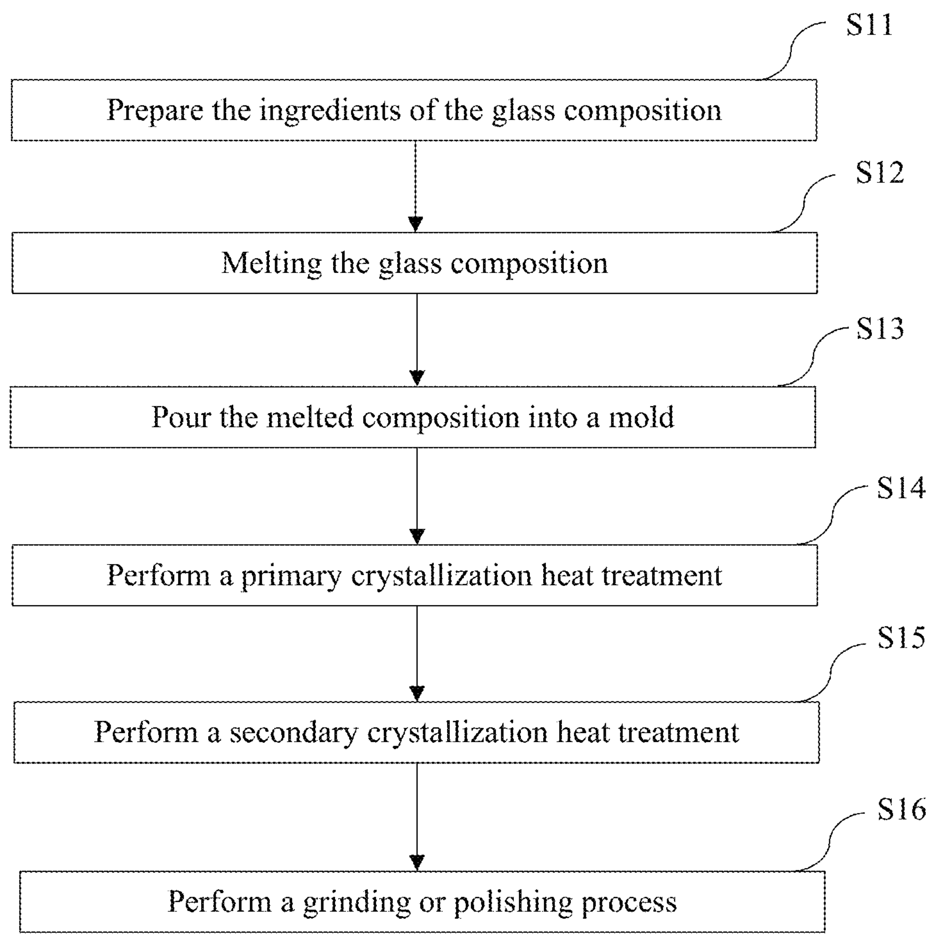
FIG. 1 illustrates an example flow chart for producing a crystallized glass according to one embodiment of the present disclosure.

The foregoing and other aspects of the present disclosure will become more clearly apparent through preferred embodiments described with reference to the accompanying drawings. Hereinafter, embodiments of the present disclosure will be described in detail such that those skilled in the art can easily understand and reproduce them.

The present disclosure relates to a crystallized glass having excellent processability (machinability) and plasma corrosion resistance and to dry etching parts including the same.

In order for materials to be applied to the dry etching process, the materials need to withstand harsh environments such as fluorinated gas. As a result of development of a glass composition that can be applied to an environment in which fluorinated gas is used and that exhibits easy processability compared to conventional ceramic materials, the present disclosure proposes crystallized glass having plasma corrosion resistance and exhibiting easy processability required for a dry etching process, and a method for preparing the same.

Specifically, crystallized glass having such plasma corrosion resistance includes crystalline and vitreous structures. The crystalline structure includes lithium disilicate as a main crystalline phase and at least one among lithium phosphonate ($Li_3PO_4$), lithium metasilicate ($Li_2SiO_3$), silica ($SiO_2$), and zirconia ($ZrO_2$) as a sub-crystalline phase.

In terms of processability and plasma corrosion resistance, the crystallized glass may contain at least 30% by weight of the crystalline structure and preferably 40% to 80% by weight of the crystalline structure.

In the above and below description, the term "main crystalline phase" will be understood as a crystalline phase occupying at least 50% by weight or more with respect to the total weight of the crystalline phases. In terms of processability and plasma corrosion resistance, the crystallized glass may contain at least 55% by weight of the lithium disilicate as the main crystalline phase and preferably 60% to 95% by weight of the lithium disilicate.

In the corrosion-resistive crystallized glass of the present disclosure, the silica crystalline phase as the sub-crystalline phase may have various crystalline forms but may not be limited thereto. Preferably, the silica crystalline phase includes at least one selected from cristobalite, α-quartz, and tridymite in terms of plasma corrosion resistance, strength, and processability, but the examples of the silica crystalline phase may not be limited thereto.

Preferably, the crystallized glass may have a hardness (Vickers hardness, Hv) of 720 to 750 kg/mm$^2$ in terms of processability.

In addition, the plasma corrosion-resistive crystallized glass of the present disclosure preferably has an average grain size of 0.05 μm to 5 μm in terms of strength, plasma corrosion resistance, and processability. In terms of processability, the crystalline phase may have an average grain size of 0.05 μm to 0.5 μm. However, in terms of strength and plasma corrosion resistance, the crystalline phase may have an average grain size of 0.5 μm to 5 μm.

The crystallized glass having plasma corrosion resistance according to the present disclosure expresses a high strength different from that of general glass materials in terms of strength. Specifically, the crystallized glass is a high strength material having a breaking strength of 350 to 500 MPa based on three-point flexural strength (ISO 4049, ANSI/ADA Specification No. 27).

The plasma corrosion-resistive crystallized glass having a maximum surface roughness Ra of 0.1 μm may be useful as fine ceramics for dry etching processes.

As long as the crystallized glass satisfies these conditions, the preparation method thereof is not limited. For example, the plasma corrosion-resistive crystallized glass may be prepared from a glass composition including: 60% to 85% by weight of $SiO_2$; 10% to 15% by weight of $Li_2O$; 1% to 6% by weight of $P_2O_5$; 0.1% to 5% by weight of a divalent element oxide alone represented by $Me^{II}O$ (where, $Me^{II}$ is Ca, Mg, Zn, Ba, or Be) or a mixture of the divalent element oxides; 0.1% to 5% by weight of a monovalent element oxide alone represented by $Me^{I}_2O$ (where $Me^{I}$ is K, Na, Rb, or Cs) or a mixture of the monovalent element oxides; and 1% to 10% by weight of a trivalent element oxide alone represented by $Me^{III}_2O_3$ (where, $Me^{III}$ is Al, B, Y, La, Ga, or In) or a mixture of the trivalent element oxides.

In the glass composition, $P_2O_5$ acts as a nucleating agent, the divalent element oxide represented by $Me^{II}O$ may serve to increase the softening point and plasma corrosion resistance of glass, the monovalent element oxide represented by $Me^{I}_2O$ may serve to lower the glass melting temperature, and the trivalent element oxide represented by $Me^{III}_2O_3$ may serve as an intermediate agent for glass and affect corrosion resistance.

FIG. 1 illustrates an example flow chart of a method for producing a crystallized glass according to one embodiment of the present disclosure. The method for producing a crystallized glass from such a glass composition first prepares a glass melt by the various melting methods.

The glass melt is prepared by weighing and mixing the ingredients of the glass composition in step S11. In this step, $Li_2CO_3$ may be added instead of $Li_2O$ because carbon dioxide ($CO_2$) in $Li_2CO_3$ is discharged and removed as a gas in the glass melting process. In addition, as the monovalent element oxides represented by $Me^{I}_2O$, for example, $K_2CO_3$ or $Na_2CO_3$ may be added instead of $K_2O$ or $Na_2O$, respectively because carbon dioxide ($CO_2$) is discharged and removed as a gas in the glass melting process.

The glass composition may be mixed using a dry mixing process, and a ball milling process may be used as the dry mixing process. The ball milling process will be described in detail. Starting materials are charged into a ball milling machine, and the ball mill is rotated at a constant speed to mechanically pulverize and uniformly mix the starting materials. The balls used in the ball mill may be balls made of a ceramic material such as zirconia or alumina, and the balls may have the same size or may have at least two different sizes. Depending on the target particle size, the sizes of the balls, the milling time, and the rotation speed per minute of the ball mill are controlled. For example, to achieve the target particle size, the size of the balls may be set in a range of about 1 mm to 30 mm, and the rotational speed of the ball mill may be set in a range of about 50 to 500 rpm. Ball milling is preferably performed for 1 to 48 hours depending on the target particle size. Through the ball milling, the starting materials are pulverized into fine particles having a uniform particle size, and the particles are uniformly mixed.

The mixed starting materials are put into a crucible and then heated so that the glass composition is melted in step S12. Here, "melting" means that the glass composition is changed to a liquid state having a viscosity from a solid state. The melting furnace is preferably made of a material having a high melting point, high strength, and a low contact angle in order to suppress the sticking of the melt. To this end, the melting furnace is preferably made of platinum (Pt), diamond-like-carbon (DLC), or chamotte or is preferably coated with platinum (Pt) or diamond-like-carbon (DLC).

Melting is preferably performed at 1,400° C. to 2,000° C. under normal pressure for 1 to 12 hours. When the melting temperature is lower than 1,400° C., the starting material may not be completely melted. When the melting temperature exceeds 2,000° C., it is not economical because excessive energy is consumed. Therefore, it is preferable that the melting is performed at a temperature in the above-mentioned range. In addition, when the melting time is too short, the glass composition may not be sufficiently melted whereas when the melting time is too long, excessive energy is consumed, resulting in being not economical. It is preferable that the temperature increase rate of the melting furnace is about 5° C./min to 50° C./min. When the temperature increase rate of the melting furnace is low, it takes a long time to melt the glass composition, resulting in reduction in productivity. On the other hand, when the temperature increase rate of the melting furnace is excessively high, the amount of volatilization of the starting material may increase due to a rapid temperature increase, resulting in deterioration of the physical properties of the crystallized glass. Therefore, it is preferable to raise the temperature of the melting furnace at a temperature increase rate in the above-described range. The melting may be preferably performed in an oxidizing atmosphere such as oxygen ($O_2$) or air.

After obtaining the melt of the glass composition in the above manner, the melt is poured into a predetermined mold to obtain crystallized glass for producing a molded article of a desired shape and size in step S13. The mold is preferably made of a material having a high melting point, high strength, and a low contact angle in order to suppress the sticking of the glass melt. To this end, the mold may be made of a material such as graphite or carbon. To prevent thermal shock, it is preferable that the melt is poured into the mold after the mold is preheated to a temperature in the range of 200° C. to 300° C.

In order to prepare a plasma corrosion-resistive crystallized glass according to one embodiment of the present disclosure from the melt of the glass composition prepared in the way described above, it is preferable to perform a heat treatment at a temperature in the range of 400° C. to 850° C. in step S14. After this primary crystallization heat treatment, it is possible to obtain a crystallized glass including lithium disilicate as a main crystalline phase and at least one crystalline phase among lithium phosphonate ($Li_3PO_4$), lithium metasilicate ($Li_2SiO_3$), silica ($SiO_2$), and zirconia ($ZrO_2$) as a sub-crystalline phase. The crystallized glass may be crystallized glass including such a crystalline phase and the remaining vitreous phase. The crystalline phase may have an average grain size of 0.05 to 0.5 μm, so that the crystallized glass has a satisfiable final strength and an adequate cutting strength, thereby being easily processed.

On the other hand, in order to further enhance the strength of the crystallized glass having undergone the primary crystallization heat treatment, an additional heat treatment may be further performed in step S15 (hereinafter in the description, this additional heat treatment will be referred to as "a secondary crystallization heat treatment"). The secondary crystallization heat treatment may be preferably performed at a temperature in the range of 800° C. to 950° C., and the crystalline phase grows through such heat treatment and the grain size of the crystalline phase increases. Preferably, through the secondary crystallization heat treatment under the above conditions, the average grain size of the crystalline phase becomes 0.5 to 5 μm, so that the processability can be maintained while the strength is improved.

In order to use the crystallized glass of the present disclosure as fine ceramics for a semiconductor process, a grinding or polishing process may be involved in step S16. The grinding or polishing process may be performed after the first crystallization heat treatment and may be performed even after the second heat treatment.

For example, the grinding process may be performed after the primary crystallization heat treatment, and the polishing process may be performed after the secondary crystallization heat treatment. Alternatively, both of the grinding process and the polishing process may be performed after the secondary crystallization heat treatment.

In this case, the polishing process may be performed so that the average roughness Ra ultimately becomes at most 0.1 μm which is a useful roughness for fine ceramics.

It can be confirmed from the hardness value that the crystallized glass (hereinafter, referred to as glass-ceramics) according to the present disclosure is advantageous in terms of processability (cuttability). Table 1 below shows the result of measuring the hardness (Vickers hardness, Hv) of the glass-ceramics compared to the alumina and zirconia that are commonly used as materials for focus rings among parts for semiconductor manufacturing processes.

The size of the specimens used was 15×15×0.6 (mm), and the specimens had a surface roughness Ra of 0.5 μm.

As shown in the results of Table 1, the hardness of the crystallized glass proposed in the present disclosure is about ½ that of other materials, indicating that the cuttability is excellent. From this, it can be predicted that a lot of time and money will not be consumed in grinding and polishing when manufacturing parts such as a focus ring from the crystallized glass of the present disclosure.

TABLE 1

| Hardness values of materials | | | |
|---|---|---|---|
| Sample name | Zirconia | Alumina | Glass-Ceramics |
| Hardness (Hv, $kg/mm^2$) | 1351.6 ± 17.35 | 1653.1 ± 162.93 | 733.81 ± 1.16 |

Next, in order to examine the plasma corrosion resistance of the crystallized glass of the present disclosure, a dry etching process was performed under the conditions described below. Specifically, for the three types of specimens (having a size of 15×15×0.6 (mm)), dry etching was performed by the Korea Institute of Industrial Technology under the following conditions by request.

(1) Equipment: 2300 Poly Lam Research (USA)

(2) Test Condition

1) Power—RF Power (Source): 1,000 W; RF Power (Bias): 500 W

2) Gas: Total 10 mmTorr
$CF_4$: 120 sccm/Ar: 60 sccm/$O_2$: 20 sccm

3) Time—repeat 6 times the event of a 10-minute exposure and a 5-minute pause

Figure 2A:
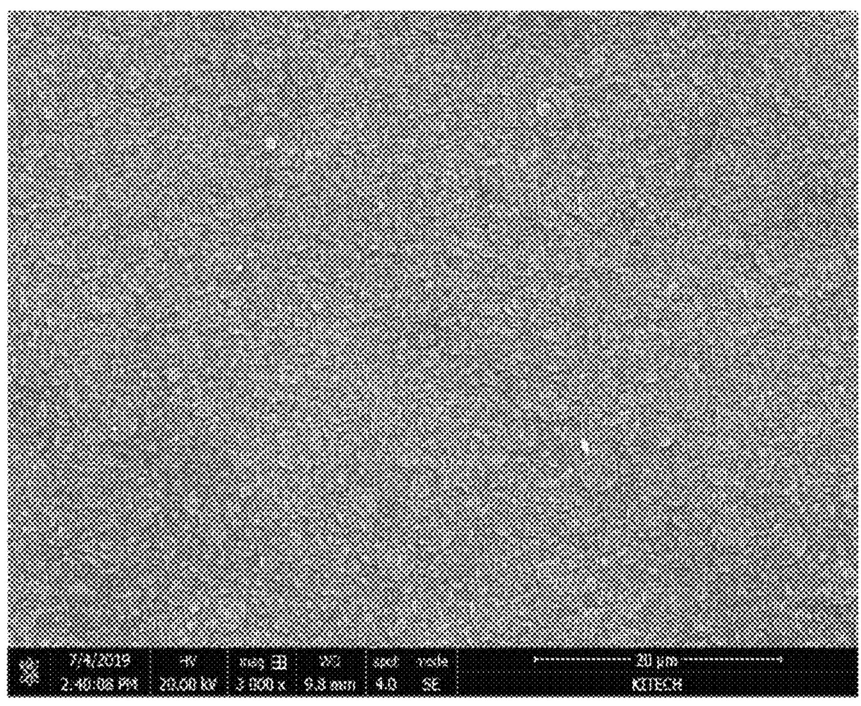
FIGS. 2A, 2B and 2C are 3K-magnification SEM images of a microstructure after dry etching embodiments of the present disclosure.
Figure 2B:
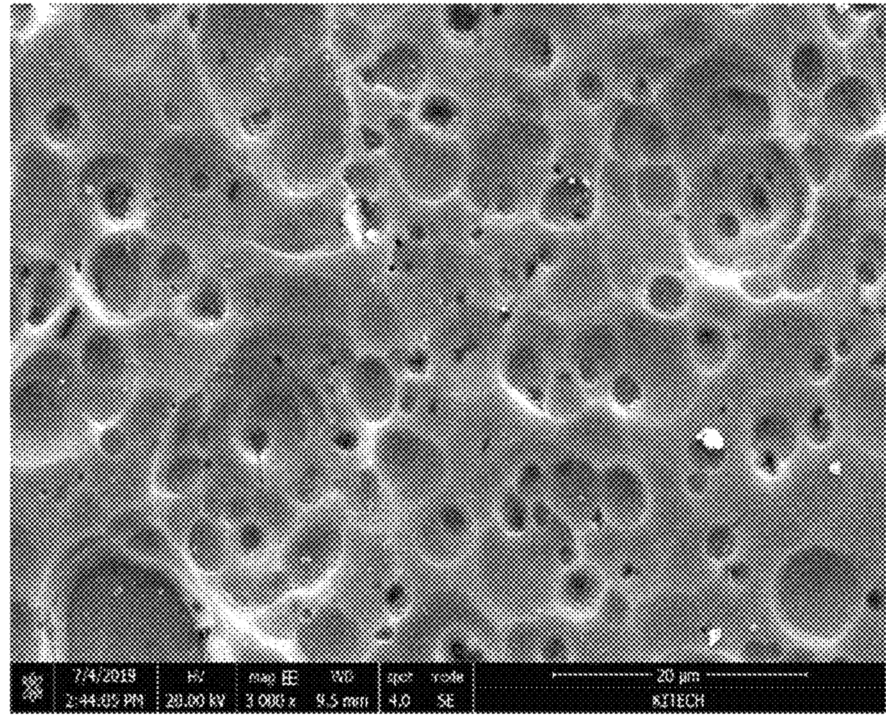
Figure 2C:
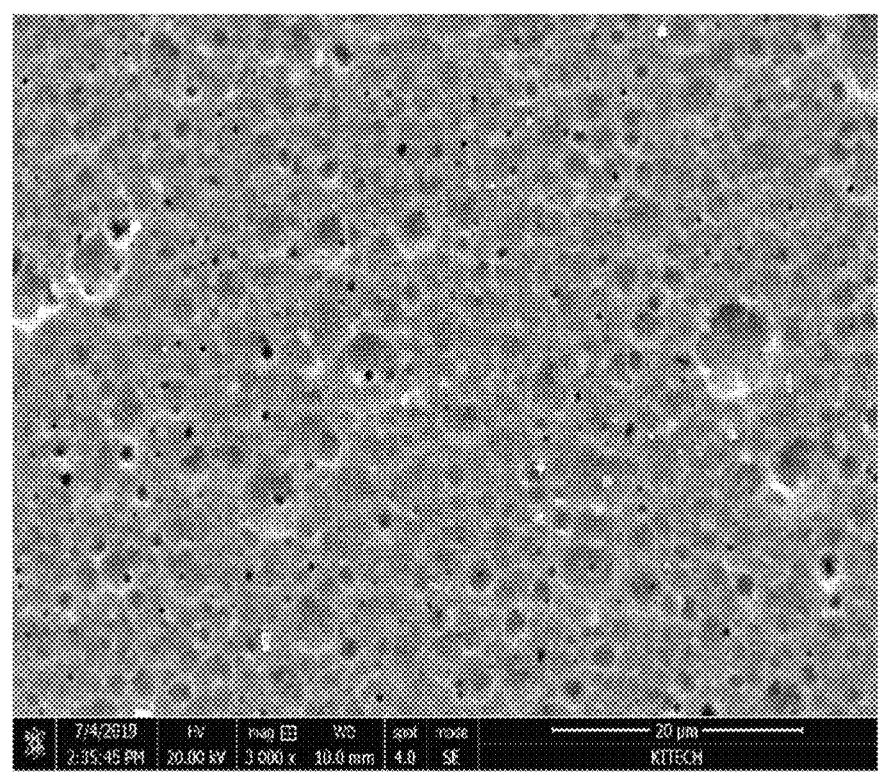

After a dry etching was performed in the same manner as described above, the microstructure of each specimen was observed under a scanning electron microscope (SEM). The result is shown in FIGS. 2A to 2C.

As described above, not only wafers but also process parts such as focus rings and edge rings are etched through the general dry etching process, and pores are generated. This can be easily confirmed from an SEM image after the etching of alumina (FIG. 2B) and a SEM image after the etching of zirconia (FIG. 2C). However, in contrast to the conventional materials, in the case of the crystallized glass of the present disclosure, an SEM image (FIG. 2A) shows that pores and etching traces rarely occur through etching.

In addition, the surface roughness was measured for each specimen, before and after the etching process. The results are shown in Table 2 below. The surface roughness was measured under an atomic force microscope (AFM).

In Table 2 below, the mean change in surface roughness for each specimen is obtained by subtracting the surface roughness value before etching (Ra) from the surface roughness value after etching (Ra), and the average value of these changes in surface roughness is then calculated.

From the results in Table 2, the amount of change in surface roughness before and after dry etching for the crystallized glass is about ¼ times that of alumina and about 1/1.5 times that of zirconia. In addition, it is seen that the corrosion resistance of the crystallized glass of the present disclosure is excellent because the surface after the etching is even as shown in FIGS. 2A to 2C.

TABLE 2

| | | Surface roughness before etching (Ra, nm) | Surface roughness after etching (Ra, nm) | Mean change in surface roughness (nm) |
|---|---|---|---|---|
| Glass-Ceramics | 1 | 4.4 | 54.0 | 43.08 |
| | 2 | 4.9 | 45.0 | |
| | 3 | 3.3 | 46.4 | |
| | 4 | 3.1 | 42.2 | |
| | 5 | 3.8 | 47.3 | |
| Alumina | 1 | 4.0 | 130.0 | 171.0 |
| | 2 | 5.0 | 171.0 | |
| | 3 | 15.4 | 211.0 | |
| | 4 | 6.3 | 178.0 | |
| | 5 | 65 | 260.7 | |
| Zirconia | 1 | 8.0 | 78.0 | 60.61 |
| | 2 | 2.5 | 49.0 | |
| | 3 | 2.2 | 93.0 | |
| | 4 | 2.0 | 48.9 | |
| | 5 | 2.554 | 51.4 | |

In addition, the weight change before and after dry etching was measured using a precision electronic scale, and the results are shown in Table 3 below. As a result of the measurement, it was found that the weight loss of the crystallized glass according to the present disclosure was smaller by about 11% compared to the existing materials. This is a result that shows that the crystallized glass according to the present disclosure is etched less in a severe plasma atmospheric condition. In Table 3 below, the average weight change is calculated by obtaining a weight change value for each specimen by subtracting the weight value after etching from the weight value before etching and then averaging the weight change values.

TABLE 3

| | | Weight before etching (g) | Weight after etching (g) | Average weight change (mg) |
|---|---|---|---|---|
| Glass-Ceramics | 1 | 0.39230 | 0.38989 | 2.308 |
| | 2 | 0.39415 | 0.39169 | |
| | 3 | 0.39398 | 0.39172 | |
| | 4 | 0.39448 | 0.39222 | |
| | 5 | 0.39359 | 0.39144 | |
| Alumina | 1 | 0.72264 | 0.72001 | 2.586 |
| | 2 | 0.72124 | 0.71868 | |
| | 3 | 0.71924 | 0.71669 | |
| | 4 | 0.72042 | 0.71783 | |
| | 5 | 0.72219 | 0.71959 | |
| Zirconia | 1 | 1.09921 | 1.09653 | 2.592 |
| | 2 | 1.10173 | 1.09905 | |
| | 3 | 1.10192 | 1.09934 | |
| | 4 | 1.10176 | 1.09928 | |
| | 5 | 1.09843 | 1.09589 | |

Figure 3:
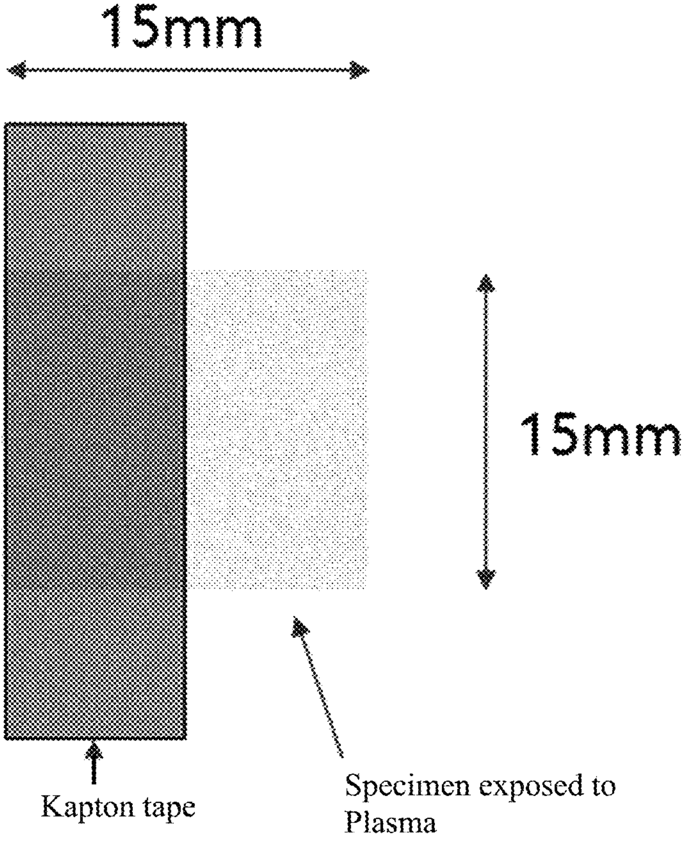
FIG. 3 is an example diagram illustrating a method of masking a specimen using Kaptone tape made of polyimide to measure an etch rate.

When performing the dry etching, as shown in FIG. 3 for each specimen, half (referred to as exposed surface) of the specimen was covered with a Kaptone tape (a polyimide tape) not to be exposed to the plasma and the other half (referred to as a non-exposed surface) was exposed to the plasma so as to be etched. Then, the step difference between the exposed surface and the non-exposed surface was measured with a confocal microscope, and the etch rate was measured therefrom. The results are shown in Table 4. Referring to the results in Table 4, it is possible to confirm that the etch rate of the crystallized glass according to the present disclosure is only half that of alumina and is similar to that of zirconia.

TABLE 4

| | Glass-Ceramics | Zirconia | Alumina |
|---|---|---|---|
| Step difference (μm) | 2.83702 | 2.74467 | 5.24507 |
| | 2.17369 | 2.60843 | 4.99973 |
| | Avg 2.505355 | Avg 2.67655 | Avg 5.1224 |
| Average etch rate (nm/min) | 41.75 | 44.61 | 85.37 |

In the experimental examples described above, as the crystallized glass (Glass-Ceramics) of the present disclosure, a crystallized glass containing lithium disilicate as the main crystal phase and silica ($SiO_2$) as a sub-crystalline phase was evaluated. However, it is possible to obtain a comparable effect in all kinds of crystallized glass satisfying the composition or physical properties according to the above-described embodiments of the present disclosure. For reference, Table 5 below shows examples of the types of fine ceramic parts used in dry etching processes, main application materials, and general replacement cycles.

TABLE 5

| No. | Name | Material | Replacement cycle |
|---|---|---|---|
| 1 | View port | Quartz | — |
| 2 | Battle | Si—SiC | 6 months to 1 year |
| 3 | Electrode | Si | 500 hours |
| 4 | Upper ring | Quartz | 300 hours |
| 5 | Upper confinement ring | Quartz | 300 hours |
| 6 | Lower confinement ring | Quartz | 300 hours |
| 7 | Hot edge ring | Si, $Al_2O_3$ | 150 hours |
| 8 | Insulator pipe | Quartz | 300 hours |
| 9 | Inner focus ring | $Al_2O_3$ | 300 hours |
| 10 | Outer focus ring | $Al_2O_3$ | 300 hours |
| 11 | Lift pin | $Al_2O_3$ | — |
| 12 | ESC | — | — |
| 13 | Bottom Insulator | $Al_2O_3$ | — |

From Table 5, it can be seen that various fine ceramic parts are required for dry etching processes, and most of these parts are consumable parts. In addition, it can be confirmed that alumina ($Al_2O_3$) is mainly used as the material of the parts. As described above, in the case of the crystallized glass proposed in the present disclosure, it is superior in processability and plasma corrosion resistance to conventional materials. Therefore, it is confirmed that the crystallized glass of the present disclosure will be useful as an alternative to conventional materials.

In one embodiment of the present disclosure, there is provided a dry etching process component including a plasma corrosion-resistive crystallized glass including crystalline and vitreous structures, in which the crystalline structure includes lithium disilicate as a main crystalline phase and at least one crystalline phase among lithium phosphonate ($Li_3PO_4$), lithium metasilicate ($Li_2SiO_3$), silica ($SiO_2$), and zirconia ($ZrO_2$) as a sub-crystalline phase.

Here, the dry etching process component including the plasma corrosion-resistive crystallized glass refers to all the cases in which the plasma corrosion-resistive crystallized glass of the present disclosure is provided as a laminate on a conventional heterogeneous material and in which the plasma corrosion-resistive crystallized glass of the present disclosure is provided as a coating layer.

Preferably, the dry etching process component according to an embodiment of the present disclosure may be made of a plasma corrosion-resistive crystallized glass including crystalline and vitreous structures, in which the crystalline structure includes lithium disilicate as a main crystalline phase and at least one selected from lithium phosphonate ($Li_3PO_4$), lithium metasilicate ($Li_2SiO_3$), silica ($SiO_2$), and zirconia ($ZrO_2$) as a sub-crystalline phase.

Such dry etching process parts have excellent plasma corrosion resistance and excellent processability, thereby being able to flexibly cope with the high integration of semiconductor elements and large-diameter Si-wafers.

While the present invention has been described with reference to exemplary embodiments, those skilled in the art will appreciate that the exemplary embodiments are presented only for illustrative purposes and the present invention is not limited to the disclosed exemplary embodiments. On the contrary, it will be understood that various modifications and equivalents thereto are possible.

The present disclosure can address the difficulty in processing and improve thermal shock stability during large-area fabrication of conventional semiconductor and electronic material ceramics by using crystallized glass having excellent processability. In addition, the present disclosure is useful for the production of dry etching process parts having improved durability during semiconductor plasma etching, thereby extending the part replacement cycle.

The invention claimed is:

1. A crystallized glass comprising a crystalline structure and a vitreous structure, wherein the crystallized glass contains 40% to 80% by weight of the crystalline structure, wherein the crystalline structure comprises lithium disilicate as a main crystalline phase and at least one crystalline phase of lithium phosphate ($Li_3PO_4$), lithium metasilicate ($Li_2SiO_3$), silica ($SiO_2$), or zirconia ($ZrO_2$) as a sub-crystalline phase, wherein the crystalline structure contains 60% to 95% by weight of the lithium disilicate as the main crystalline phase, wherein the crystallized glass has a surface roughness of 0.01 μm to 0.1 μm, wherein the main and sub-crystalline phases have an average grain size of 0.05 μm to 0.5 μm after performing a primary crystallization heat treatment at a temperature in the range of 400° C. to 850° C., wherein the main and sub-crystalline phases have an average grain size of 0.5 μm to 5 μm after performing a secondary crystallization heat treatment at a temperature in the range of 800° C. to 950° C. after the primary crystallization heat treatment, and wherein the crystallized glass has plasma corrosion resistance required for dry etching process.

* * * * *